United States Patent [19]
Kazutaka

[11] Patent Number: 5,691,241
[45] Date of Patent: Nov. 25, 1997

[54] METHOD FOR MAKING PLURALITY OF LEADFRAMES HAVING GROOVES CONTAINING ISLAND AND INNER LEADS

[75] Inventor: Shibata Kazutaka, Kyoto, Japan

[73] Assignee: Rohm Co., Ltd., Kyoto, Japan

[21] Appl. No.: 383,573

[22] Filed: Feb. 3, 1995

Related U.S. Application Data

[62] Division of Ser. No. 208,781, Mar. 9, 1994, Pat. No. 5,451,813, which is a continuation of Ser. No. 902,714, Jun. 23, 1992, abandoned.

[30] Foreign Application Priority Data

Sep. 5, 1991 [JP] Japan ................................ 3-254595
Sep. 7, 1991 [JP] Japan ................................ 3-255691

[51] Int. Cl.⁶ ........................................ H01L 23/48
[52] U.S. Cl. ............... 437/206; 437/217; 437/220; 257/672; 257/676; 257/775
[58] Field of Search ....................... 437/206, 217, 437/220; 257/672, 676, 775

[56] References Cited

U.S. PATENT DOCUMENTS

| | | | |
|---|---|---|---|
| 3,947,867 | 3/1976 | Duffek et al. | 317/234 |
| 4,099,200 | 7/1978 | Koutalides | 357/69 |
| 4,663,651 | 5/1987 | Gilder, Jr. et al. | 357/70 |
| 4,761,518 | 8/1988 | Butt et al. | 547/217 |
| 4,771,330 | 9/1988 | Long | 357/80 |
| 4,796,078 | 1/1989 | Phelps, Jr. et al. | 357/68 |
| 4,872,260 | 10/1989 | Johnson et al. | 29/827 |
| 4,920,074 | 4/1990 | Shimizu et al. | 437/211 |
| 4,994,411 | 2/1991 | Naito et al. | 437/209 |
| 5,014,113 | 5/1991 | Casto | 357/70 |
| 5,041,395 | 8/1991 | Steffen | 437/206 |
| 5,128,281 | 7/1992 | Dyer et al. | 437/225 |
| 5,151,771 | 9/1992 | Hiroi et al. | 357/70 |
| 5,362,679 | 11/1994 | Wakefield | 437/206 |
| 5,378,656 | 1/1995 | Kajihara et al. | 437/217 |
| 5,391,439 | 2/1995 | Tomita et al. | 428/571 |
| 5,451,813 | 9/1995 | Kazutaka | 257/676 |

FOREIGN PATENT DOCUMENTS

| | | | |
|---|---|---|---|
| 355127047 | 10/1980 | Japan | 257/676 |
| 357155760 | 9/1982 | Japan | 257/676 |
| 401289149 | 11/1989 | Japan | 257/676 |

Primary Examiner—Long Pham
Attorney, Agent, or Firm—Brumbaugh, Graves, Donohue & Raymond

[57] ABSTRACT

A semiconductor device includes a lead frame which has an island portion on which a semiconductor chip is mounted and which is coated with a sealing resin, inner lead portions which are connected to electrodes of the semiconductor chip and are coated with the sealing resin; and outer lead portions which are continuously extended from the inner lead portions and are not coated with the sealing resin. The island portion and inner lead portions are formed to be smaller in thickness than the outer lead portions by, for example, rolling a roller along a material for the lead frame.

6 Claims, 8 Drawing Sheets

METHOD FOR MAKING PLURALITY OF LEADFRAMES HAVING GROOVES CONTAINING ISLAND AND INNER LEADS

This application is a division of application Ser. No. 08/208,781, filed on Mar. 9, 1994 now U.S. Pat. No. 5,451,813, which is a continuation of application Ser. No. 07/902,714, filed Jun. 23, 1992 now abandoned.

BACKGROUND OF THE INVENTION

The present invention relates to a semiconductor device including a lead frame, and more particularly relates to a semiconductor device such as an integrated circuit package including an improved lead frame.

A semiconductor device such as an integrated circuit package is manufactured through a series of processing steps such as die bonding or chip bonding, wire bonding and resin molding. The steps are taken on a lead frame punched out of a thin metal plate.

Figure 1:
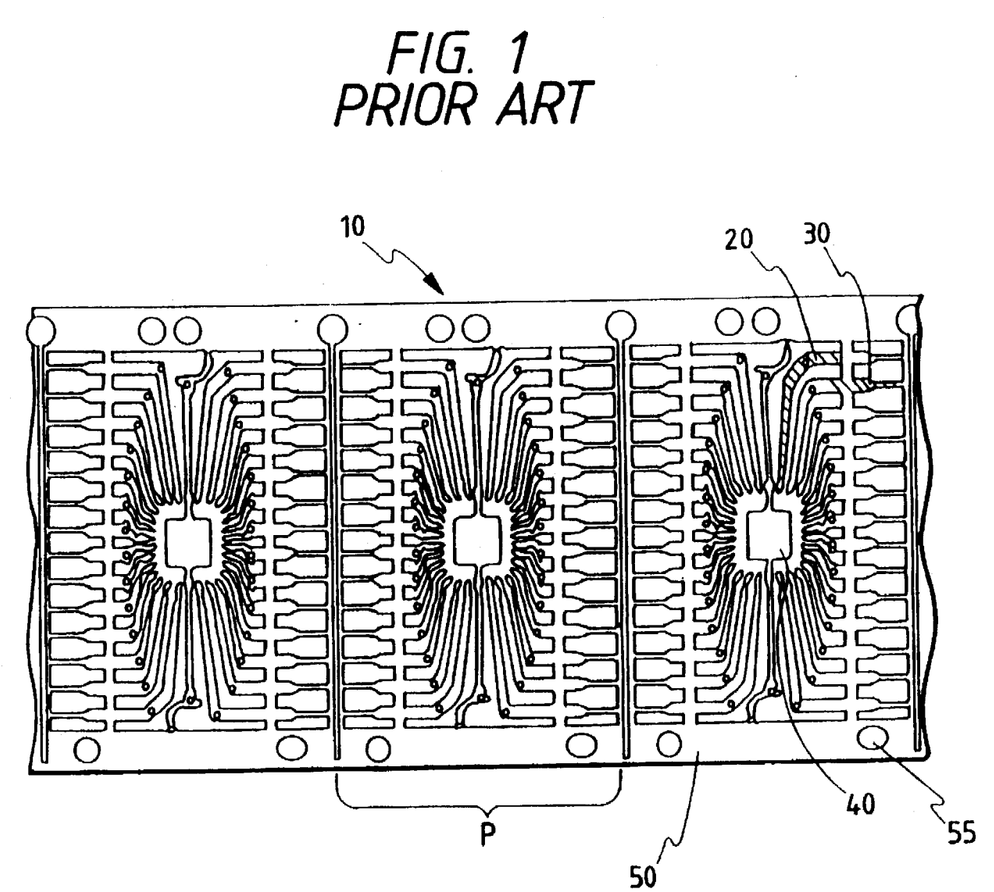
FIG. 1 is a plan view of a conventional lead frame.

FIG. 1 is a plan view of a conventional lead frame 10. P in FIG. 1 denotes a range corresponding to one integrated circuit package. The lead frame 10 mainly includes an island 40 on which a semiconductor chip is mounted, a plurality of inner lead portions 20 which are indicated by a hatching in FIG. 1 and are connected to the electrodes of the chip mounted on the island, a plurality of outer lead portions 30 which are indicated by another hatching in FIG. 1, continuously extend to the inner lead portions and are connected to a circuit board or the like, and guide rails 50 which have positioning guide holes 55 or the like.

The lead frame 10 is manufactured by punching a thin electroconductive metal plate with dies or by etching. To manufacture the integrated circuit package from the lead frame 10, the semiconductor chip is first bonded to the island 40 of the frame in a chip bonding step. After that, the tips of the inner lead portions 20 of the lead frame 10, which extend toward the island 40, are connected to the electrodes of the chip with gold wires or the like in a wire bonding step. A resin is then molded on the chip on the lead frame 10 in a resin molding step so that the island 40 and the inner lead portions 20 are coated with the resin. The lead frame 10 is thereafter cut off from the guide rails in a lead frame cutoff step so that the integrated circuit package is completed. The lead frame 10 is manufactured for each semiconductor device in conformity with a specification such as the form of a semiconductor chip mounted on the island 40 and the number of the terminals thereof.

Since the lead frame 10 is usually manufactured by punching a flat metal plate or by the like, the frame has a uniform thickness for different portions such as the inner and the outer lead portions 20 and 30. The thickness is generally 0.25 mm for a DIP (Dual In-Line Package), or 0.15 mm for a SOP (Small Outline Package) and a QFP (Quad Flat Package).

The reducibility of the interval between the inner lead portions 20 depends on the thickness of the metal plate, which cannot be set below a limit because each outer lead portion 30 is required to be high enough in mechanical strength. The thickness of the integrated circuit package is determined by the thickness of the lead frame 10, that of the semiconductor chip mounted on the island, the diameter of the bonding wire and so forth.

If the thickness of the lead frame 10 is decreased, the outer lead portions 30 are likely to be made not high enough in mechanical strength and heat conduction capacity. This is a problem. If the thickness of the lead frame 10 is increased, the reduction in the interval between the inner lead portions 20 is likely to be limited to make it impossible to diminish the thickness of the package enough. This is also a problem.

SUMMARY OF THE INVENTION

The present invention was made in order to solve the above-mentioned problems. Accordingly, it is an object of the invention to provide a semiconductor device including a lead frame which has a thin portion, and it is another object of the invention to provide a method of easily manufacturing the semiconductor device including such a lead frame.

According to a first aspect of the present invention, a semiconductor device includes a lead frame which has inner lead portions coated with a sealing resin, and outer lead portions which continuously extend to the inner lead portions and are not coated with the resin, in which the inner lead portions are smaller in thickness than the outer lead portions.

According to a second aspect of the present invention, a semiconductor device includes a lead frame which has an island on which a semiconductor chip is mounted and which is coated with a sealing resin at resin molding, inner lead portions which are connected to the electrodes of the chip mounted on the island and are coated with the resin, and the outer lead portions which continuously extend to the inner lead portions and are not coated with the resin, in which the island is smaller in thickness than the outer lead portions.

A plurality of lead frames are continuously formed so that a lead frame for one semiconductor device adjoins to the other frame at the outer lead portions of the frames.

According to a third aspect of the present invention, a semiconductor device includes a lead frame which has an island on which a semiconductor chip is mounted and which is coated with a sealing resin; inner lead portions which are connected to the electrodes of the chip mounted on the island and are coated with the resin; and outer lead portions which continuously extend to the inner lead portions and are not coated with the resin, in which the island and the inner lead portions are smaller in thickness than the outer lead portions. A plurality of such lead frames are continuously formed so that the inner and outer lead portions of each lead frame for one semiconductor device correspond to those of the other adjacent lead frame for another semiconductor device, respectively.

A first method of manufacturing a semiconductor device is characterized in that a material for the frame is formed with a groove by rolling the material with a roller, and thereafter the island and the inner lead portions are formed within the groove.

A second method of manufacturing a semiconductor device is characterized in that a material for the lead frame is formed with the island and the inner lead portions, and thereafter a groove is formed within the island and the inner lead portions by rolling the material with a roller.

Since the inner lead portions of the lead frame provided in accordance with the first aspect of the present invention are smaller in thickness than the outer lead portions thereof, the interval between the inner lead portions can be reduced without decreasing the thickness of the outer lead portions. Since the inner lead portions are coated with the sealing resin, the portions are unlikely to be affected by an external force although the portions are not large in thickness.

Since the island of the lead frame provided in accordance with the second aspect of the present invention is smaller in thickness than the outer lead portions thereof, the thickness of the semiconductor device including the semiconductor chip mounted on the island can be reduced although the thickness of the outer lead portions is not decreased. Since the island is coated with the sealing resin, the island is unlikely to be affected by an external force although the island is not large in thickness.

Further, the inner and outer lead portions of the lead frame, which is provided for one semiconductor device in accordance with the third aspect of the present invention, correspond to those of the other adjacent lead frame for another semiconductor device, respectively, so that the inner lead portions and the islands formed in decreased thickness and the outer lead portions formed in unchanged thickness are continuously formed. For that reason, the part of the material formed in decreased thickness can be formed by rolling of a roller having a simple form as a disk.

DETAILED DESCRIPTION OF THE INVENTION

Preferred embodiments of the present invention will be described with reference to the drawings attached hereto. The equivalent parts in the embodiments to the conventional lead frame shown in FIG. 1 are denoted by the same reference symbols in the drawings, and not described in detail hereinafter.

Figure 3A:
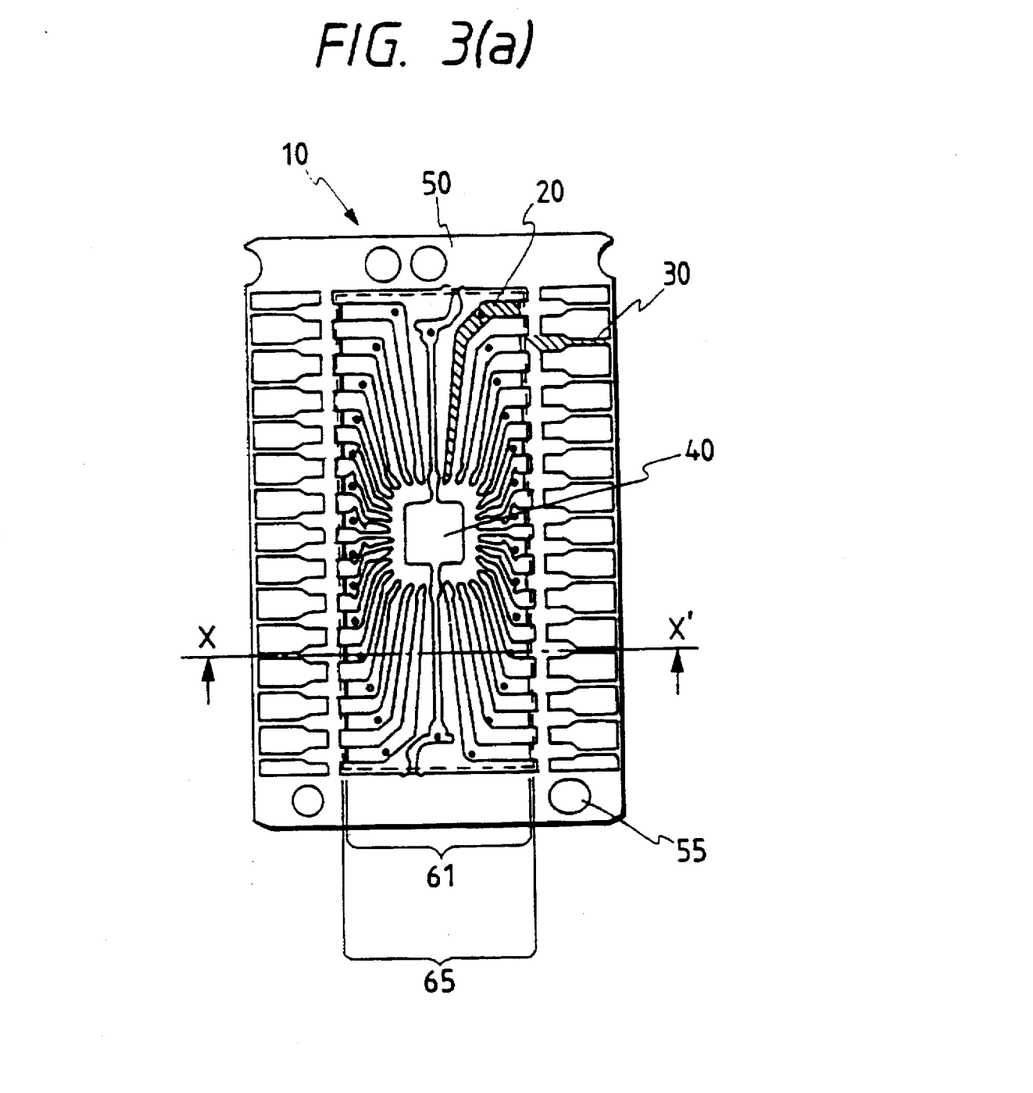
FIGS. 3(a) and 3(b) show the range of a single lead frame for one integrated circuit package.
Figure 3B:
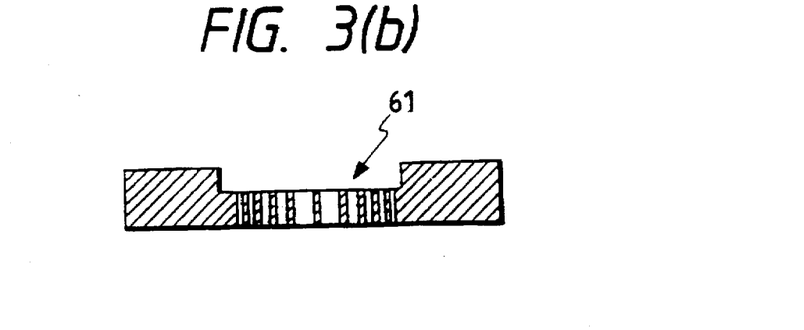

FIGS. 3(a) and 3(b) show a lead frame 10 for one integrated circuit package as a semiconductor device according to a first embodiment. A plurality of such lead frames are continuously formed so that one frame for one integrated circuit package adjoins to the other frame at the outer lead portions of the frames. The lead frames are subjected to processing such as die bonding by a prescribed length unit such as a length corresponding to ten packages, or in a state that the lead frames are wound as a hoop or a roll on a reel or the like. FIG. 3(a) is a plan view of the lead frame 10, and FIG. 3(b) is a cross-sectional view of the frame along a line X–X'.

The lead frame 10 has the same constitution as the conventional lead frame shown in FIG. 1 except that the lead frame of the embodiment has a groove 61. The range of the groove 61 is smaller than that of a molded area 65 of the lead frame 10, on which a sealing resin is molded and which is shown by a dotted line in FIG. 3(a). The lead frame 10 includes an island 40 on which a semiconductor chip is mounted and which is coated with the sealing resin at resin molding, inner lead portions 20 which are connected to the electrodes of the chip mounted on the island and are coated with the resin, and the outer lead portions 30 which continuously extend to the inner lead portions and are not coated with the resin at the resin molding. Thus, the inner lead portions 20 and the island 40 in the groove 61 are coated with the resin.

The groove 61 is formed in only one side of the lead frame 10 whose other side is flat. The inner lead portions 20 and the island 40 which are located within the groove 61 are smaller in thickness than the outer lead portions 30 located outside the groove.

Figure 2A:
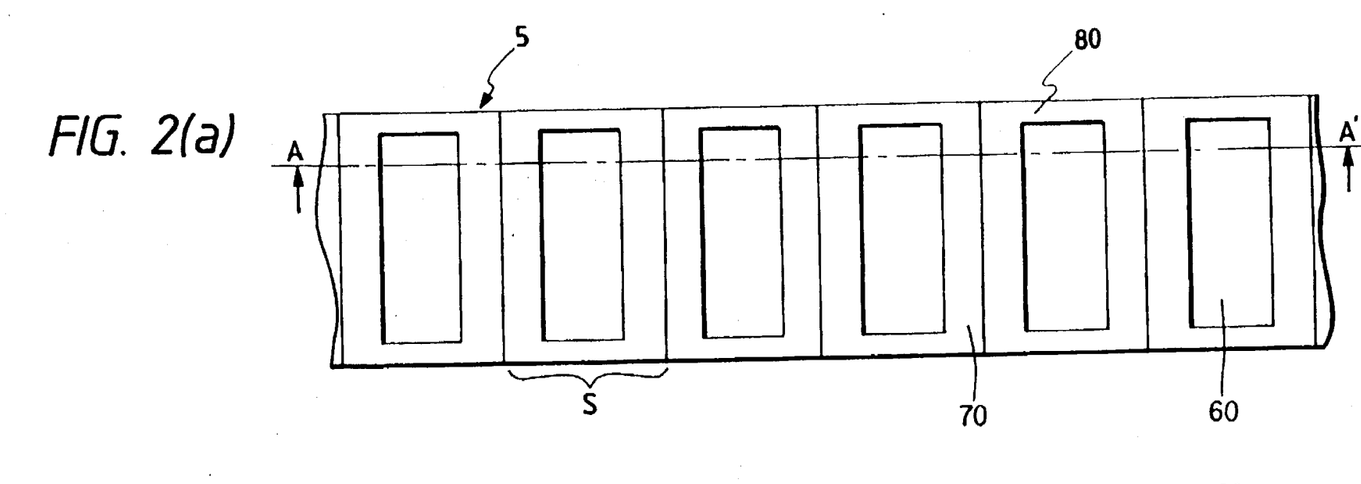
FIGS. 2(a) and 2(b) show a major part of a metal plate for a lead frame which is a first embodiment of the present invention.
Figure 2B:
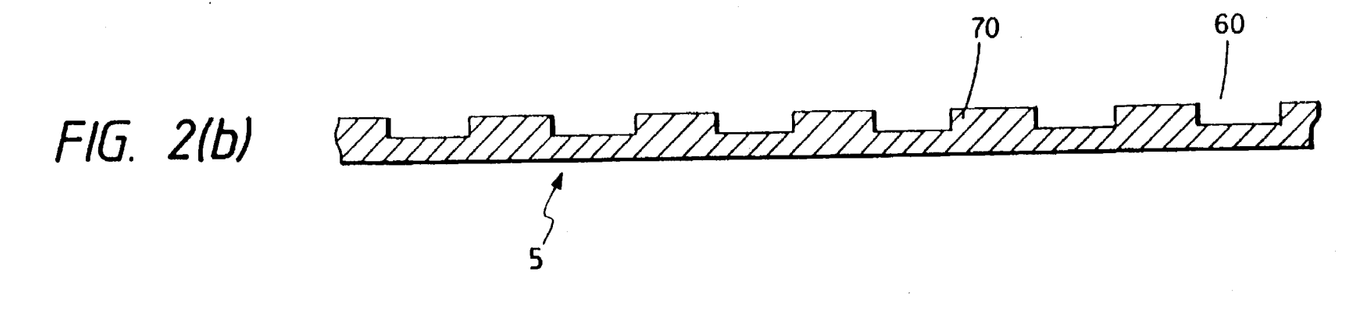

A method of manufacturing the lead frame 10 will be described. In the method, a material for the lead frame 10 is formed with a groove 60 in a part for the inner lead portions 20 and island 40 of the frame, and thereafter formed with the inner lead portions and the island within the groove. The material for the lead frame is a nickel alloy, a copper alloy or the like which is conventionally used as the lead frame. FIG. 2(a) is a plan view of a metal plate 5 used in this embodiment, and FIG. 2(b) is a longitudinally sectional view of the plate along a line A–A'. The metal plate 5 is formed by providing the groove 60 in a flat metal plate conventionally used as the lead frame material.

S in FIG. 2(a) indicates a range for one integrated circuit package shown in FIG. 3(a). The groove 60, outer lead portion parts 70 and guide rail parts 80 of the metal plate 5 correspond to the groove 61, outer lead portions 30 and guide rails 50 of the lead frame 10 shown in FIG. 3(a), respectively. The groove 60 can be formed in the metal plate 5 by rolling, stamping, etching or the like. For example, a part of the flat metal plate 5 wound as a hoop is pressed, stamped with dies or the like, so that the plate is plastically deformed at the part to reduce the thickness thereof.

The lead frame 10 may be reduced in thickness only at the island 40 or at the inner lead portions 20 to decrease the thickness of the integrated circuit package.

Figure 5A:
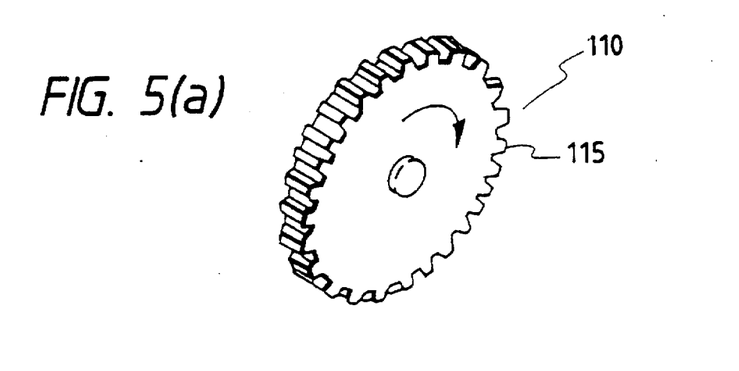
FIGS. 5(a) and 5(b) are perspective views of a roller and a stamper for forming a groove in the metal plate, respectively.

FIG. 5(a) shows a roller 110 used for the rolling. The roller 110 has projections 115 on the peripheral surface of the roller. The roller 110 is caused to press the flat metal plate 5 while rotate thereon, so that the plate is formed with the grooves 60 as shown in FIG. 2.

Figure 5B:
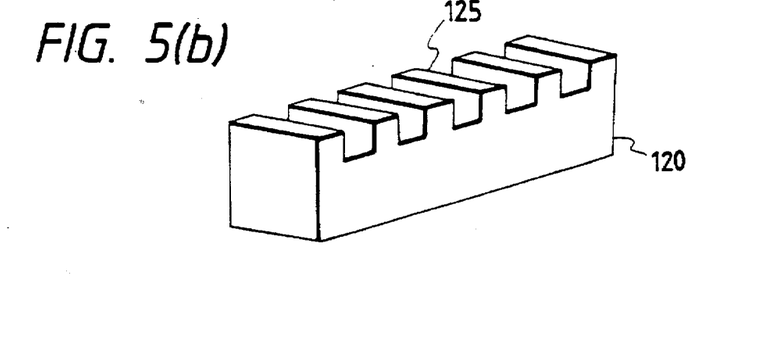

FIG. 5(b) shows a stamper 120 used for the stamping. The stamper 120 has projections 125. The stamper 120 is pressed onto the flat metal plate 5 to form the grooves 60 therein as shown in FIG. 2.

For the above-mentioned etching, a conventional art of etching may be adopted. For example, the metal plate 5 is put in contact with an etching liquid while a mask having prescribed openings is interposed between the plate and the liquid.

After the metal plate 5 is formed with the groove 60, the plate is formed with the island 40, the inner lead portions 20 and the outer lead portions 30 by punching, etching or the like. For that purpose, a conventional art of punching, etching or the like may be adopted.

Although the groove 60 is formed in only one side of the metal plate 5, the present invention is not confined thereto. For example, each of the roller 110 and the stamper 120 shown in FIGS. 5(a) and 5(b) may be put into contact with both the sides of the flat metal plate 5 to form the grooves 60 in both the sides. Therefore, the form of the cross section of each lead frame part of the metal plate 5 is not confined to that shown in FIG. 2(b). Further, although the metal plate 5 has two kinds of thicknesses as shown in FIG. 2(b), the plate may have more than two thicknesses.

In another method of manufacturing the lead frame 10, the metal plate 5 is formed with the inner lead portions 20, the outer lead portions 30 and the island 40, and thereafter formed with the groove 61 at the inner lead portions and the island. The method is the same as the previously described method except that the groove is formed after the inner and the outer lead portions and the island are formed.

Figure 4:
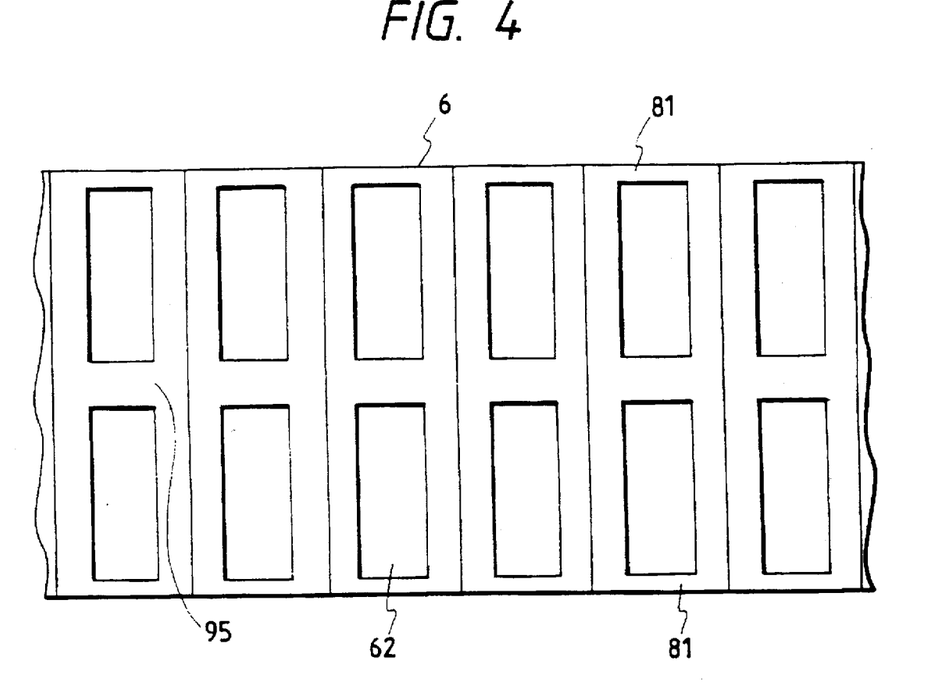
FIG. 4 is a plan view of a major part of a metal plate for a lead frame which is a second embodiment of the present invention.

FIG. 4 is a plan view of a metal plate 6 used in a second embodiment. The metal plate 6 is formed with two rows of grooves 62 between both the guide rail parts 81 of the plate. The metal plate 6 is also formed with a resin injecting portion 95 between each lateral pair of the grooves 62. The resin injecting portion 95 corresponds to the guide of the runner portion of a molding die. Since the two rows of grooves 62 are provided in the metal plate 6, a sealing resin can be molded on two lead frames at the same time. The metal plate 6 can be formed with the grooves 62 in the same manner as the preceding embodiment shown in FIGS. 2 and 3. For example, a roller, a stamper or the like, which has two rows of projections, is used to form the grooves 62 in the metal plate 6. The number of the rows of the grooves 62 and that of the rows of the projections may be more than two.

As described above, a lead frame provided for a semiconductor device in accordance with a first aspect of the present invention includes inner lead portions which are coated with a sealing resin, and outer lead portions which continuously extend to the inner lead portions and are not coated with the resin, in which the inner lead portions are made smaller in thickness than the outer lead portions. Accordingly, the interval between the inner lead portions can be reduced without lowering the strength and heat conduction capacity of the outer lead portions. Besides, the strength of the frame feed side rails and outer lead portions of the lead frame can be enhanced. Further, since the interval between the inner lead portions can be reduced, the degree of freedom of the design of the lead frame can be heightened.

A lead frame provided for a semiconductor device in accordance with a second aspect of the present invention includes an island on which a semiconductor chip is mounted and which is coated with a sealing resin, inner lead portions which are connected to the electrodes of the chip mounted on the island and are coated with the resin, and outer lead portions which continuously extend to the inner lead portions and are not coated with the resin, in which the island is made smaller in thickness than the outer lead portions. Accordingly, the thickness of the semiconductor device such as an integrated circuit package can be reduced without lowering the strength and heat conduction capacity of the outer lead portions. Besides, the strength of the frame feed side rails and outer lead portions of the lead frame can be enhanced.

Further, since each of the lead frames is reduced in the thickness of the inner lead portions or the island, the cost of the material for the frame can be decreased.

Figure 7A:
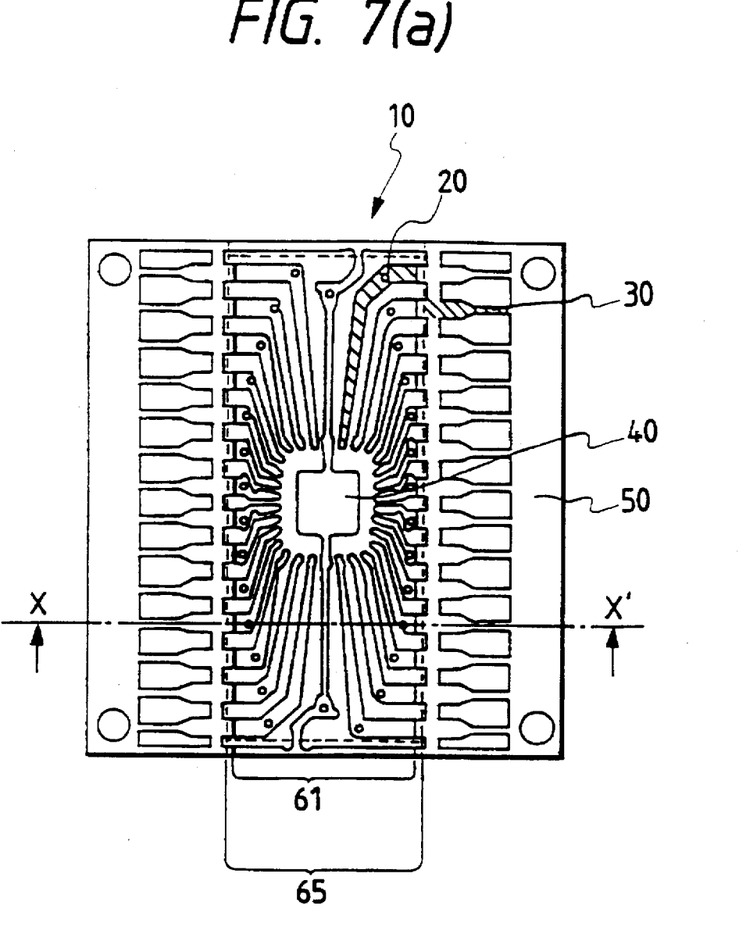
FIGS. 7(a) and 7(b) show the range of a single lead frame for one integrated circuit package.
Figure 7B:
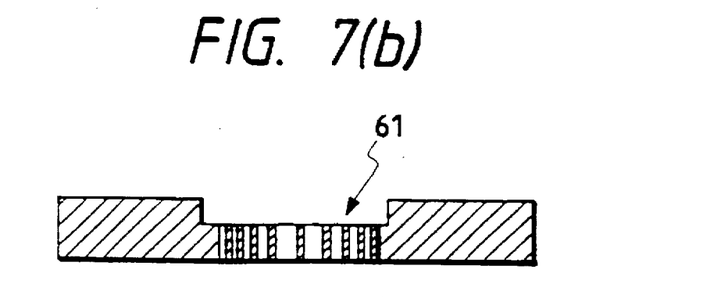

FIG. 7 shows a lead frame 10 for one integrated circuit package as a semiconductor device according to a third embodiment.

Figure 10:
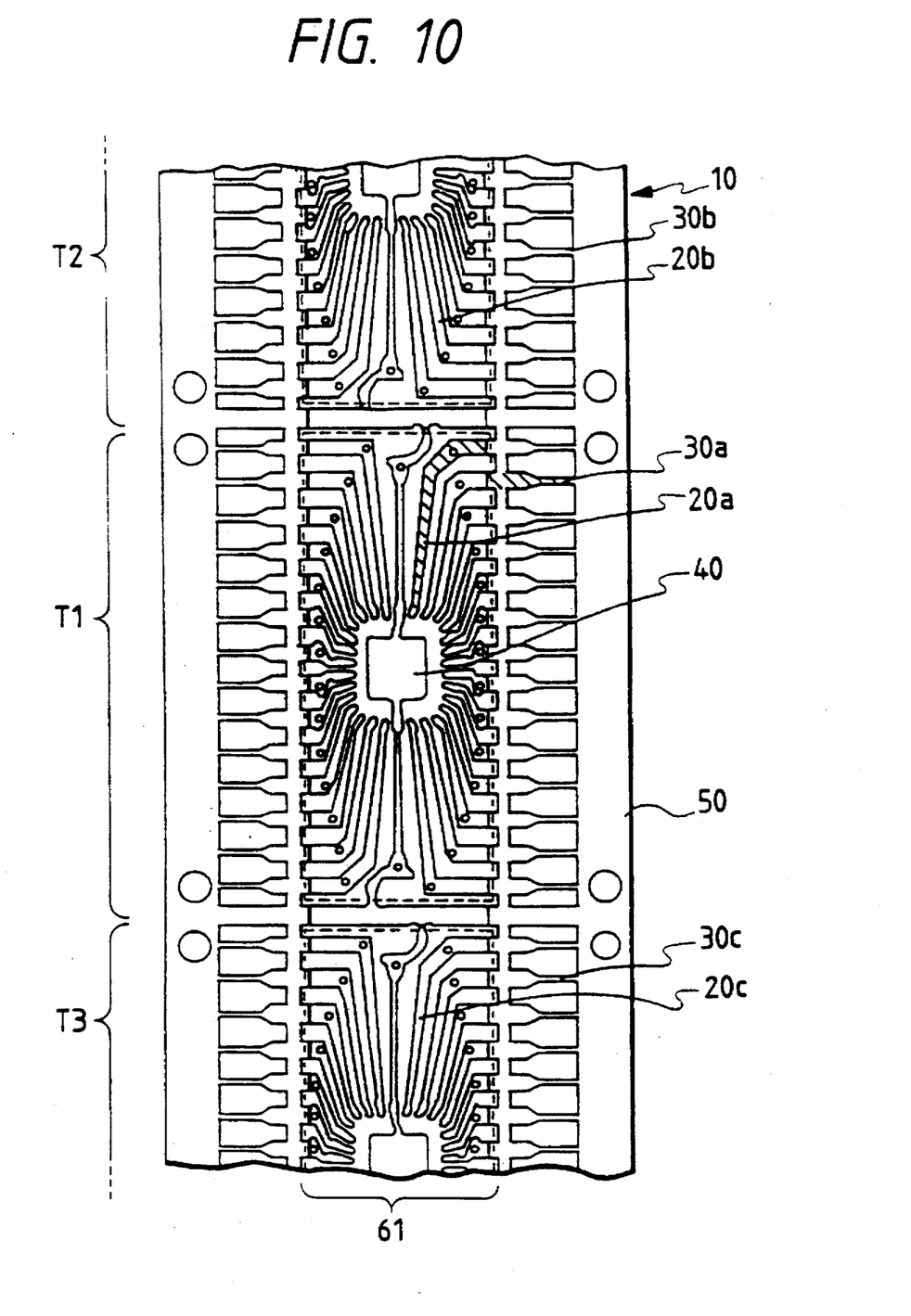
FIG. 10 is a plan view of the lead frame of the third embodiment.

As shown in FIG. 10, plural portions T1, T2 and T3, each corresponding to one package, are continuously formed so that the inner and outer lead portions 20a, 30a of portion T1 adjoin to inner lead portions 20b, 20c and outer lead portions 30b, 30c of the adjacent parts T2, T3, respectively. The lead frames 10 have the groove 61 extending continuously in the longitudinal direction thereof. The lead frames 10 are subjected to processing such as die bonding by a prescribed length unit such as a length corresponding to ten packages, or in a state that the lead frames are wound as a hoop or a roll on a reel or the like. FIG. 7(a) is a plan view showing the lead frame 10 and FIG. 7(b) is a cross-sectional view showing the lead frame along a line X-X'.

The lead frame 10 has the same constitution as the conventional one shown in FIG. 1 except that the lead frame of the embodiment has the groove 61. The width of the groove 61 is smaller than that of the molded area 65 of the lead frame 10, on which a sealing resin is molded and which is shown by a dotted line in FIG. 7(a). The lead frame 10 includes an island 40 on which a semiconductor chip is mounted and which is coated with the sealing resin at resin molding; the inner lead portions 20 which are connected to the electrodes of the chip mounted on the island and are coated with the resin at the resin molding; and the outer lead portions 30 which continuously extend to the inner lead portions and are not coated with the resin at the resin molding. Thus, the inner lead portions 20 and the island 40 formed within the groove 61, are coated with the sealing resin. The groove 61 is provided in one side of the lead frame 10 whose other side is flat. Therefore, the inner lead portions 20 and the island 40 are smaller in thickness than the outer lead portions 30 formed outside the groove.

Figure 6A:
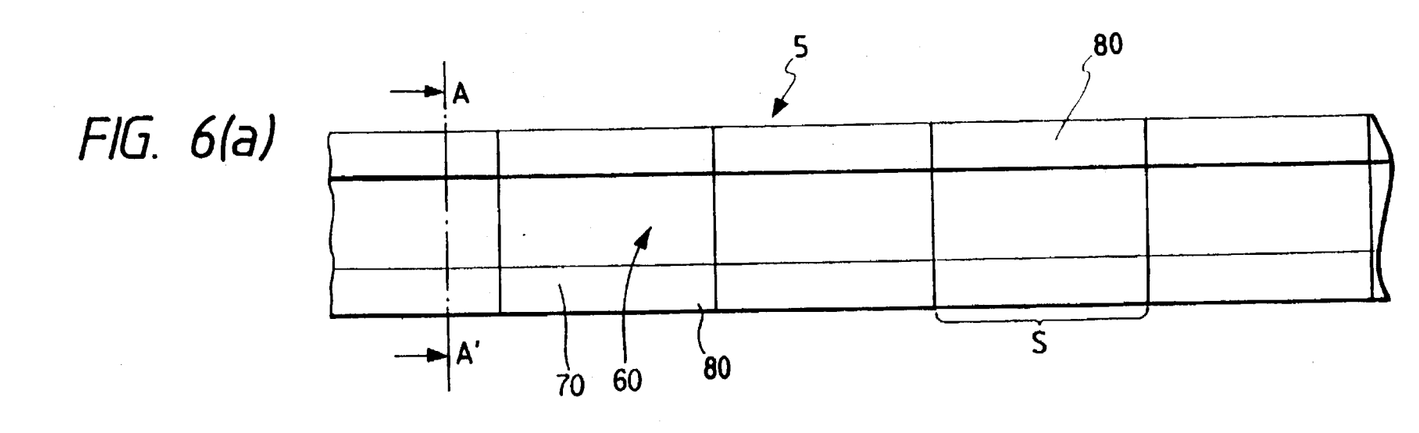
FIGS. 6(a) and 6(b) show a metal plate for a lead frame which is a third embodiment of the present invention.
Figure 6B:
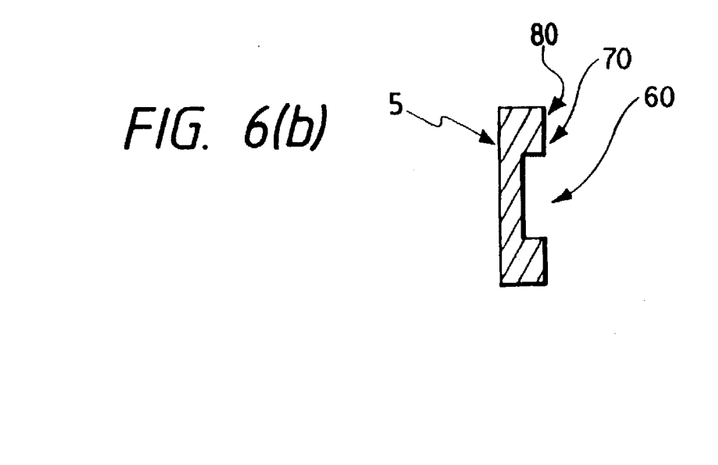

A method of manufacturing the lead frame 10 of the third embodiment will be described. In the method, a material for the lead frame is formed with a groove, and is thereafter formed with the inner lead portions 20 and the island 40 within the groove. The material for the lead frame is a nickel alloy, a copper alloy or the like which are conventionally used as the lead frame 10. FIG. 6(a) is a plan view of a metal plate 5 used in the embodiment and FIG. 6(b), is a cross-sectional view of the plate along a line A-A'. The metal plate 5 is formed by providing the groove 60 in a flat metal plate conventionally used as a material of the lead frame 10.

S in FIG. 6(a) denotes a range corresponding to one lead frame shown in FIG. 7(a). The groove 60, the outer lead portion parts 70 and guide rail parts 80 of the metal plate 5 correspond to the groove 61, outer lead portions 30 and guide rails 50 of the lead frame 10 shown in FIG. 7(a), respectively.

The groove 60 may be formed by, for example, pressing, stamping through a die etc., etching through contact to an etching solution. However, since the groove 60 continuously and rectilinearly extends along the guide rail parts 80 as shown in FIG. 6(a), the groove is easily formed, in this embodiment, in the metal plate 5 by continuously rolling the part between the outer lead portion parts with a roller to plastically deform the part to reduce the thickness thereof.

Figure 9:
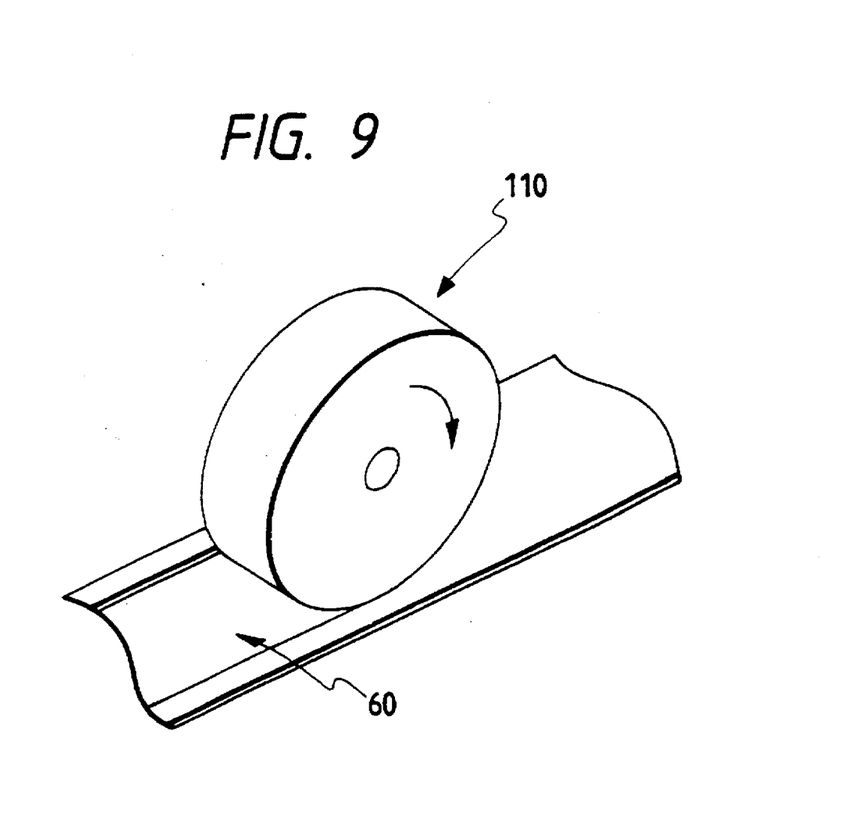
FIG. 9 is a perspective view to illustrate forming a groove in the metal plate with a roller in manufacturing the lead frame of the third embodiment.

FIG. 9 schematically shows a state in which a roller 110 is pressing the metal plate 5. When the roller 110 is caused to press the flat metal plate 5 while rotating thereon, the groove 60 can be formed as shown in FIGS. 6(a) and 9.

The metal plate 5 is thereafter formed with the inner lead portions 20, the outer lead portions 30, the island 40 and so forth by punching, etching or the like, which may be performed in a conventional manner.

Although the groove 60 is provided in only one side of the metal plate 5, the present invention is not confined thereto. For example, grooves may be provided in both the sides of the metal plate by putting rollers in pressure contact with both the sides. Therefore, the form of the cross section of the lead frame 10 is not confined to that shown in FIG. 6(b). Although the metal plate 5 has two different thicknesses as shown in FIG. 6(b), the plate may have more than two different thicknesses.

In yet another method of manufacturing the lead frame 10, the lead pattern such as the inner lead portions 20 and the island 40 is formed in a flat metal plate, and the groove 61 is thereafter formed in the lead pattern. The method is the same as the preceding one except that the groove is formed after the lead pattern is formed.

Figure 8:
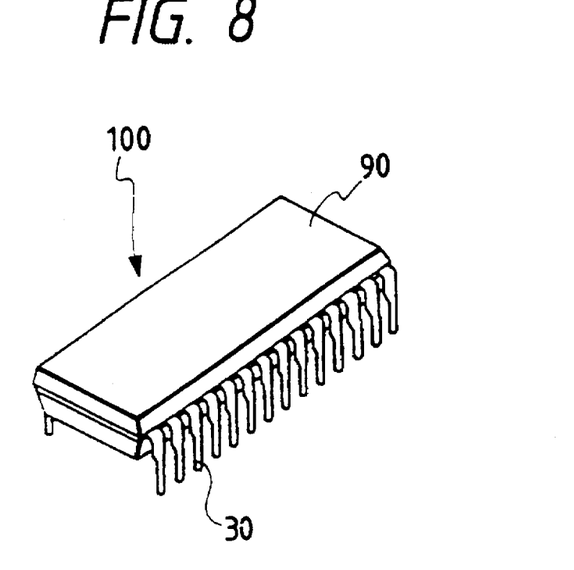
FIG. 8 is a perspective view of a package including the lead frame.

FIG. 8 is a perspective view of an integrated circuit package 100 including a semiconductor chip and the lead frame 10 according to the embodiments of the present invention. In the package, the semiconductor chip and the inner lead portions 20 and island 40 of the lead frame 10, which are provided within the groove 61, are coated with the sealing resin 90, but the outer lead portions 30 of the frame are not coated with the resin.

The present invention is not confined to the above-described embodiments, But the invention may be embodied as other various semiconductor devices or the like.

A lead frame provided for a semiconductor device in accordance with the embodiment of the present invention includes an island on which a semiconductor chip is mounted and which is coated with a sealing resin; inner lead portions which are connected to the electrodes of the chip mounted on the island and are coated with the resin; and outer lead portions which continuously extend to the inner lead portions and are not coated with the resin, in which the island and the inner lead portions are smaller in thickness than the outer lead portions. Accordingly, the interval between the inner lead portions and the thickness of the semiconductor device can be reduced without lowering the strength and heat conduction capacity of the outer lead portions. Since a plurality of such lead frames are continuously formed so that the inner and outer lead portions of each lead frame correspond to those of the other adjacent lead frame, respectively, the inner and the outer lead portions different from each other in thickness can be easily formed. Since the frame feed side rails and outer lead portions of the lead frame are larger in thickness than the other parts of the frame, the side rails and the outer lead portions can be enhanced in strength.

To manufacture the lead frame, a metal plate is formed with a groove by rolling the plate with a roller and thereafter formed with the outer lead portions and with the island and the inner lead portions within the groove, or the metal plate is formed with the inner and the outer lead portions and the island and thereafter formed with the groove within the inner lead portions and the island by rolling the plate with the roller. The lead frame can thus be easily manufactured.

What is claimed is:

1. A method of manufacturing a semiconductor device, comprising the steps of:

forming a plurality of lead frames, each having an island portion, inner lead portions and outer lead portions, the outer lead portions of each lead frame adjoining and being directly connected to corresponding outer lead portions of an adjacent lead frame; and forming a groove within each lead frame containing said island portion and inner lead portions of the lead frame.

2. A method of manufacturing a semiconductor device as claimed in claim 1, further comprising the steps of mounting a semiconductor chip on said island portion of said each frame, bonding electrodes of said semiconductor chip to said inner lead portions, molding said island portion and inner lead portions, and cutting said lead frames to form said semiconductor device.

3. A method of manufacturing a semiconductor device, comprising the steps of:

forming a plurality of connected lead frames, each having an island portion, inner lead portions and outer lead portions and forming a groove extending along the plurality of connected lead frames to reduce the thickness of the island portions and the inner lead portions of the lead frames with respect to the outer lead portions.

4. A method of manufacturing a semiconductor device as claimed in claim 3, further comprising the steps of mounting a semiconductor chip on said island portion of said each frame, bonding electrodes of said semiconductor chip to said inner lead portions, molding said island portion and inner lead portions, and cutting said lead frames to form said semiconductor device.

5. A method of manufacturing a semiconductor device as claimed in claim 3, wherein the groove is formed by rolling a roller along a material for said lead frames, and thereafter said island portion and inner lead portions are formed within said groove.

6. A method of manufacturing a semiconductor device as claimed in claim 3, wherein said island and inner lead portions are formed in a material for said frames, and thereafter the groove is formed containing said island portion and inner lead portions by rolling a roller along said material.

* * * * *